United States Patent
Molina et al.

(10) Patent No.: US 8,897,388 B2
(45) Date of Patent: Nov. 25, 2014

(54) CREST FACTOR REDUCTION (CFR) USING ASYMMETRICAL PULSES

(71) Applicant: LSI Corporation, Milpitas, CA (US)

(72) Inventors: Albert Molina, Novelda (ES); Kameran Azadet, Pasadena, CA (US); Chengzhou Li, Bridgewater, NJ (US)

(73) Assignee: LSI Corporation, Milpitas, CA (US)

( * ) Notice: Subject to any disclaimer, the term of this patent is extended or adjusted under 35 U.S.C. 154(b) by 64 days.

(21) Appl. No.: 13/661,295

(22) Filed: Oct. 26, 2012

(65) Prior Publication Data

US 2013/0114652 A1    May 9, 2013

Related U.S. Application Data

(60) Provisional application No. 61/552,242, filed on Oct. 27, 2011.

(51) Int. Cl.

| | | |
|---|---|---|
| *H04L 27/00* | (2006.01) | |
| *H04B 1/04* | (2006.01) | |
| *G06F 5/01* | (2006.01) | |
| *H04L 25/03* | (2006.01) | |
| *H04L 1/00* | (2006.01) | |
| *G06F 9/30* | (2006.01) | |
| *H04B 1/62* | (2006.01) | |
| *H04L 27/233* | (2006.01) | |
| *H04L 25/02* | (2006.01) | |

(52) U.S. Cl.
CPC ................ *G06F 5/01* (2013.01); *H04B 1/0475* (2013.01); *H04L 25/03178* (2013.01); *H04L 1/0054* (2013.01); *G06F 9/3001* (2013.01); *H04B 1/62* (2013.01); *H04L 27/2334* (2013.01); *H04L 25/02* (2013.01)
USPC .......................................................... 375/295

(58) Field of Classification Search
USPC ................. 375/295, 130, 146, 219, 260, 296; 370/206, 209
See application file for complete search history.

(56) References Cited

U.S. PATENT DOCUMENTS

| | | | |
|---|---|---|---|
| 2004/0052314 A1* | 3/2004 | Copeland | 375/296 |
| 2006/0176969 A1* | 8/2006 | Trivedi | 375/260 |
| 2011/0268167 A1* | 11/2011 | Sundstrom | 375/224 |

* cited by examiner

*Primary Examiner* — Khai Tran

(74) *Attorney, Agent, or Firm* — Daniel J. Santos; Smith Risley Tempel Santos LLC

(57) ABSTRACT

Crest factor reduction (CFR) techniques are provided using asymmetrical pulses. A crest factor reduction method comprises obtaining one or more data samples; detecting at least one peak in the one or more data samples; performing peak cancellation on the at least one detected peak by applying an asymmetric cancellation pulse to the at least one detected peak; and providing processed versions of the one or more data samples. The asymmetric cancellation pulse is generated, for example, by a minimum phase filter and has a substantially minimum group delay. New peaks associated with peak re-growth are introduced substantially only to the one side of the asymmetric cancellation pulse. The process can optionally rewind by an amount greater than or substantially equal to a group delay of the asymmetric cancellation pulse to address the limited number of pre-cursors that may be present in the asymmetric cancellation pulse.

15 Claims, 5 Drawing Sheets

FOR ITERATION = 1 TO N_ITER

PEAK SEARCH 210
- BEGIN
- COMPUTE ANTENNA SAMPLES MAGNITUDE
- FIND VALUES ABOVE THRESHOLD
- FIND PEAK POSITIONS

PULSE CANCELLATION 240
- COMPUTE PULSE CANCELLATION GAINS
- FOR PEAK = 1 TO N_PEAK
  - BEGIN
  - GENERATE PULSE USING VECTOR MULTIPLICATION INSTRUCTION
  - CANCEL PULSE FROM ANTENNA USING VECTOR ADDITION INSTRUCTION
  - END
- END

HARD CLIPPING 280
- HARD CLIP THE OUTPUT WAVEFORM

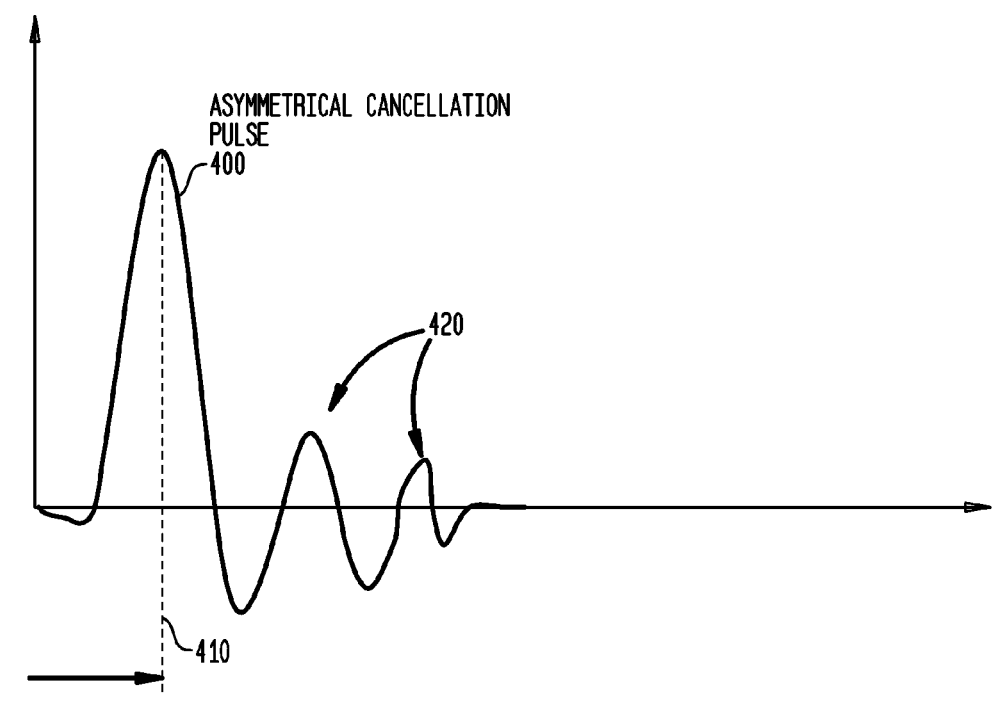

CREST FACTOR REDUCTION (CFR) USING ASYMMETRICAL PULSES

CROSS-REFERENCE TO RELATED APPLICATIONS

The present application claims priority to U.S. Patent Provisional Application Ser. No. 61/552,242, filed Oct. 27, 2011, entitled "Software Digital Front End (SoftDFE) Signal Processing and Digital Radio," incorporated by reference herein.

The present application is related to International Patent Application Serial No. PCT/PCT/US12/62195, entitled "Block-Based Crest Factor Reduction (CFR);" and U.S. patent application Ser. No. 13/661,351, entitled "Multi-Stage Crest Factor Reduction (CFR) for Multi-Channel Multi-Standard Radio," each filed contemporaneously herewith and incorporated by reference herein.

FIELD OF THE INVENTION

The present invention is related to digital signal processing techniques and, more particularly, to techniques for Crest Factor Reduction.

BACKGROUND OF THE INVENTION

The crest factor or peak-to-average ratio (PAR) is a measurement of a waveform, calculated from the peak amplitude of the waveform divided by the RMS value of the waveform. In many wireless communication technologies, the communication signals often have a high peak-to-average ratio (PAR) that can impair the efficiency of the power amplifiers (PAs) employed in wireless base stations. A number of techniques have been proposed or suggested for reducing the PAR in order to improve the efficiency of the power amplifier to thereby allow a higher average power to be transmitted before saturation occurs.

Crest Factor Reduction (CFR) is a digital technique used to reduce the PAR of the transmitted wireless signals. In a wireless transmitter, for example, the CFR is often incorporated with digital pre-distortion (DPD). The DPD serves to linearize the power amplifier to improve the efficiency of the power amplifier. CFR is often used in conjunction with DPD to maximize the transmit average power for a given power amplifier saturation voltage. Frequently, the CFR is positioned after a digital up conversion (DUC) stage and before DPD and/or equalization.

Generally, Crest Factor Reduction techniques employ peak detection and then peak cancellation by subtracting a cancellation pulse from the detected peaks, to reduce the peak amplitude and thereby reduce the PAR. The cancellation pulse is pre-computed and has a frequency response that matches the signal/channel spectral response. Thus, by design, the clipping noise is confined inside the signal channel, and does not introduce any noise in adjacent channels or out of band.

When canceling peaks, however, new peaks are introduced (this is known as "peak re-growth") due to the ringing on both sides of the pulse (the pulse is traditionally designed as a linear phase symmetrical FIR filter with a plurality of taps). There are taps on both sides of the center tap. Thus, peaks can be introduced in current or past sample values. In order to address the peaks introduced in past samples, existing CFR algorithms require multiple iterations to cancel all peaks, thereby impairing efficiency. Thus, a need exists for Crest Factor Reduction techniques that can be performed with a reduced number of iterations and with reduced complexity.

SUMMARY OF THE INVENTION

Generally, crest factor reduction (CFR) techniques are provided using asymmetrical pulses. According to one aspect of the invention, a crest factor reduction method comprises obtaining one or more data samples; detecting at least one peak in the one or more data samples; performing peak cancellation on the at least one detected peak by applying an asymmetric cancellation pulse to the at least one detected peak; and providing processed versions of the one or more data samples.

The asymmetric cancellation pulse is generated, for example, by a minimum phase filter and has a substantially minimum group delay. The exemplary asymmetric cancellation pulse comprises side taps substantially only to one side of a center tap of the asymmetric cancellation pulse, wherein the one side is in a direction the one or more samples are processed. In this manner, new peaks associated with peak re-growth are introduced substantially only to the one side of the asymmetric cancellation pulse. To address the limited number of pre-cursors that may be present in the asymmetric cancellation pulse, the process can rewind by an amount greater than or substantially equal to a group delay of the asymmetric cancellation pulse before processing additional samples.

A more complete understanding of the present invention, as well as further features and advantages of the present invention, will be obtained by reference to the following detailed description and drawings.

BRIEF DESCRIPTION OF THE DRAWINGS

FIG. 2 illustrates exemplary pseudo code for a suitable Crest Factor Reduction algorithm;

FIG. 4 illustrates an asymmetric cancellation pulse employed in accordance with an embodiment of the invention.

DETAILED DESCRIPTION

Figure 1:
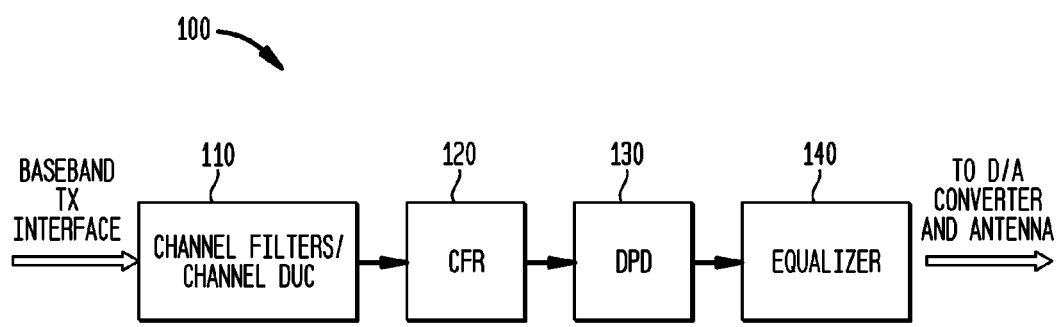
FIG. 1 illustrates portions of an exemplary transmitter in which aspects of the present invention may be employed.

FIG. 1 illustrates portions of an exemplary transmitter 100 in which aspects of the present invention may be employed. As shown in FIG. 1, the exemplary transmitter portion 100 comprises a channel filter and digital up conversion (DUC) stage 110, a crest factor reduction (CFR) stage 120, a digital pre-distortion (DPD) stage 130 and an optional equalization stage 140. Generally, the channel filter and digital up conversion stage 110 performs channel filtering using, for example finite impulse response (FIR) filters and digital up conversion to convert a digitized baseband signal to an intermediate frequency (IF). As indicated above, the crest factor reduction stage 120 limits the PAR of the transmitted signal. The digital pre-distortion stage 130 linearizes the power amplifier to improve efficiency. The equalization stage 140 employs RF channel equalization to mitigate channel impairments.

According to one aspect of the invention, a minimum phase filter (causal or quasi-causal) is used to generate an asymmetric cancellation pulse having a minimum group delay, to thereby reduce latency and avoid the need for multiple iterations (significantly reducing the computational complexity of the CFR algorithm). The disclosed algorithm can be used, for example, in Crest Factor Reduction in RF Digital Front-End systems used in base stations, cellular handsets or other network elements.

In addition, even when the pulse has some limited number of pre-cursors, the disclosed CFR algorithm can still be performed in a single iteration by rewinding, i.e., backing up in time, before proceeding with the detection of the next peak in the signal waveform.

FIG. 2 illustrates exemplary pseudo code for a suitable Crest Factor Reduction algorithm 200. It is noted that any alternative Crest Factor Reduction algorithm could also be employed. As shown in FIG. 2, the exemplary Crest Factor Reduction algorithm 200 comprises three parts, namely a peak search phase 210, a pulse cancellation phase 240 and a hard clipping phase 280. The exemplary Crest Factor Reduction algorithm 200 can be implemented in hardware or in software.

The exemplary Crest Factor Reduction algorithm 200 can optionally be performed iteratively to address peak regrowth. For example, a number of iterations, N_iter, can have a typical value between 1 and 4.

During the peak search phase 210, a search is conducted through the signal to determine the number of peaks, their locations and the magnitudes above the threshold level. The exemplary Crest Factor Reduction algorithm 200 initially computes the antenna samples magnitude. The sample values above a threshold are then identified. For example, the threshold can be established based on the PAR target. Thereafter, the peak positions can be identified, for example, using a max( ) instruction.

During the pulse cancellation phase 240, the cancellation pulses are arranged at each of the peaks, then all the pulses are subtracted from the peaks. Cancellation pulses are discussed further below in conjunction with FIGS. 3 and 4. The exemplary Crest Factor Reduction algorithm 200 computes the pulse cancellation gains (e.g., threshold divided by the magnitude of the detected peaks). Thereafter, the exemplary Crest Factor Reduction algorithm 200 enters a loop to separately process each peak. For each peak, a pulse is generated, for example, using a vector multiplication instruction, and then the pulse is cancelled from the antenna, for example, using a vector addition instruction.

During the hard clipping phase 280, the exemplary Crest Factor Reduction algorithm 200 hard clips the output waveform, for example, using non-linear operations for modulus inverse. The clipping threshold level R is set based on the PAR target. The hard clipping may be performed, for example, using a polar clipping technique. Generally, polar clipping involves computing |x|, comparing |x| to a threshold R and scaling by R/|x|. If |x| is greater than R, x is replaced by R.

In a further variation, crest factor reduction can be performed in the frequency ID domain.

Figure 3:
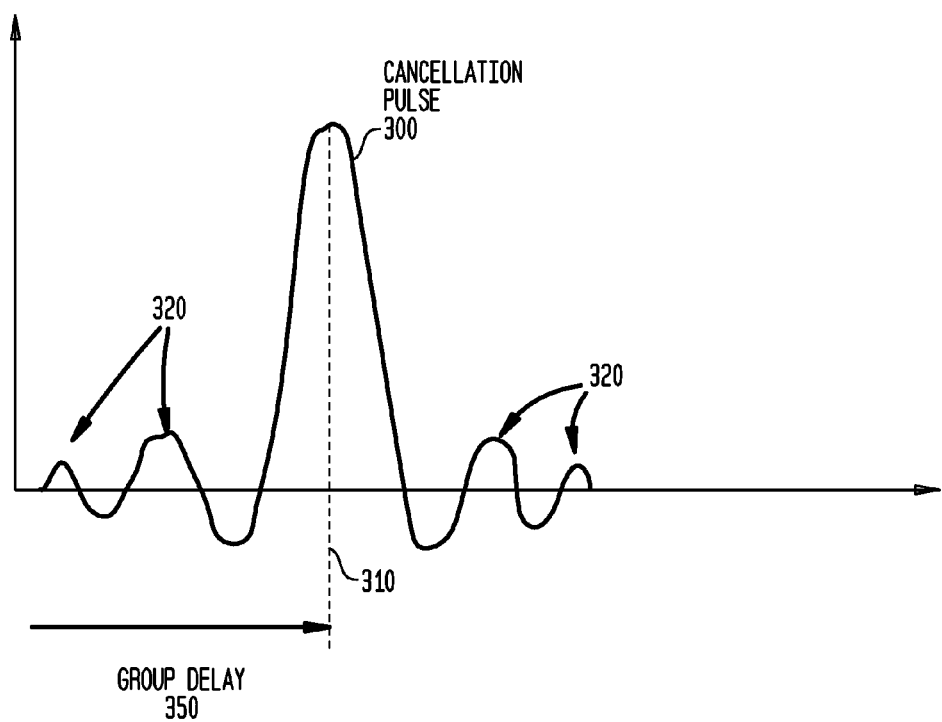
FIG. 3 illustrates a symmetric cancellation pulse employed by conventional CFR techniques.

As previously indicated, CFR techniques perform peak cancellation by subtracting a cancellation pulse from the detected peaks, to reduce the peak amplitude and thereby reduce the PAR. FIG. 3 illustrates a symmetric cancellation pulse 300 employed by conventional CFR techniques. The cancellation pulse 300 is pre-computed and has a frequency response that is similar to the frequency response of the signal channel. Thus, the clipping noise is confined inside the signal channel, and does not introduce any noise in adjacent channels or out of band.

When canceling peaks, however, new peaks are introduced (this is known as "peak re-growth") due to the ringing on both sides of the pulse (the pulse 300 is traditionally designed as a linear phase symmetrical FIR filter with a plurality of taps). As shown in FIG. 3, there are side lobes 320 associated with side taps on both sides of a center tap 310 of the pulse 300. Thus, non-causal ringing in the pulse introduces new peaks in current or past sample values. In order to address the peaks introduced in past samples, existing CFR algorithms require multiple iterations to cancel all peaks, thereby impairing efficiency. The symmetric cancellation pulse 300 is characterized by a group delay 350. Generally, group delay is a measure of the time delay of the amplitude envelopes of the various sinusoidal components of a signal through a device, and is a function of frequency for each component.

As indicated above, an aspect of the invention employs a minimum phase filter (causal or quasi-causal) that generates an asymmetric cancellation pulse having a minimum group delay, to thereby reduce latency and avoid the need for multiple CFR iterations. The minimum phase filter generates an asymmetric cancellation pulse 400, as shown in FIG. 4. The disclosed asymmetric cancellation pulses 400 allow the CFR process 200 of FIG. 2 to have minimum group delay (minimum phase) and to be performed in a single iteration and thereby reduce latency.

The present invention recognizes that the symmetrical pulses 300 of FIG. 3 are usually used to guarantee phase linearity. The impulse response of CFR pulse cancellation, however, only impacts clipping noise and phase linearity is not important. Thus, an asymmetric cancellation pulse 400 can be employed.

As shown in FIG. 4, there are side lobes 420 associated with side taps primarily only to the right (i.e., post-cursor taps) of a center tap 410 of the pulse 400. In this manner, when canceling peaks with the cancellation pulse 400, new peaks associated with "peak re-growth" are primarily introduced only on the right side of the pulse. Such new peaks will be cancelled with the original peaks as the CFR process 200 processes the signal from left-to-right.

In addition, even when the cancellation pulse 400 has a limited number of pre-cursor taps to the left of the center tap 410, the disclosed CFR algorithm 200 can still be performed in a single iteration by rewinding, i.e., backing up in time by an amount greater than or equal to the group delay 450, before proceeding with the detection of the next peak in the signal waveform.

It is noted that the asymmetric cancellation pulse techniques described herein can be applied to sample-by-sample-based and/or block-based crest factor reduction. For a discussion of block-based crest factor reduction, see International Patent Application Serial No. PCT/PCT/US12/62195, entitled "Block-Based Crest Factor Reduction (CFR)," filed contemporaneously herewith and incorporated by reference herein.

Figure 5A:
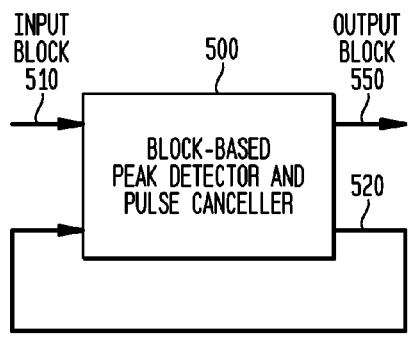
FIGS. 5A and 5B illustrate exemplary block-based and sample-based peak detector and pulse cancellers, respectively, for hardware implementations of Crest Factor Reduction.

FIG. 5A illustrates an exemplary block-based peak detector and pulse canceller 500 for a hardware implementation of Crest Factor Reduction using asymmetric pulses. The peak detector and pulse canceller 500 can be used for one or more iterations for a given input data block 510. As shown in FIG. 5A, an input data block 510 is applied to the peak detector and pulse canceller 500. The peak detector and pulse canceller 500 can optionally iterate with the processed block using a feedback path 520. After the final iteration a corresponding processed block of data 550 is output from the peak detector and pulse canceller 500.

Figure 5B:
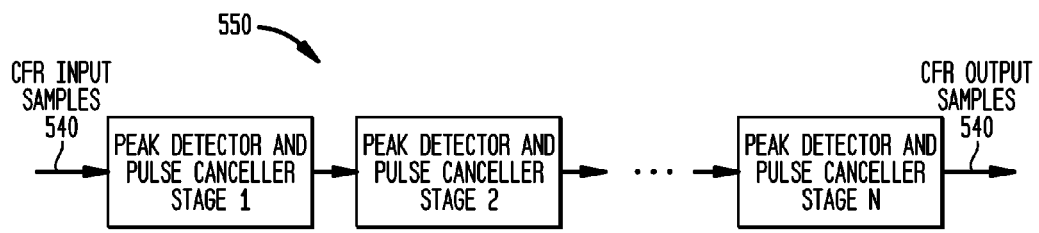

FIG. 5B illustrates an exemplary sample-based multi-stage peak detector and pulse canceller 550 for an alternate hardware implementation of Crest Factor Reduction using asymmetric pulses. As shown in FIG. 5B, a plurality of input samples 540 are applied to the multi-stage peak detector and pulse canceller 550. The multi-stage peak detector and pulse canceller 550 is comprised of a plurality of CFR stages 1-N. The multi-stage peak detector and pulse canceller 550 generates a plurality of output samples 560.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A crest factor reduction method, comprising the steps of:
obtaining one or more data samples;
detecting at least one peak in said one or more data samples;
performing peak cancellation on said at least one detected peak by applying an asymmetric cancellation pulse to said at least one detected peak, wherein said asymmetric cancellation pulse is generated by a minimum phase filter and has a substantially minimum group delay; and
providing processed versions of said one or more data samples, wherein at least one of said detecting and performing steps are performed by at least one hardware device.

2. The method of claim 1, wherein said asymmetric cancellation pulse comprises side taps substantially only to one side of a center tap of the asymmetric cancellation pulse, wherein said one side is in a direction said one or more samples are processed.

3. The method of claim 2, wherein said asymmetric cancellation pulse introduces new peaks associated with peak re-growth substantially only to said one side of said asymmetric cancellation pulse.

4. The method of claim 1, further comprising the step of rewinding said method by an amount greater than or substantially equal to a group delay of said asymmetric cancellation pulse before processing additional samples.

5. The method of claim 1, wherein said one or more data samples are processed one or more of sample-by-sample and as a block of data samples.

6. A digital processor configured to perform crest factor reduction, comprising:
a memory; and
at least one hardware device, coupled to the memory, operative to:
obtain one or more data samples;
detect at least one peak in said one or more data samples;
perform peak cancellation on said at least one detected peak by applying an asymmetric cancellation pulse to said at least one detected peak, wherein said asymmetric cancellation pulse is generated by a minimum phase filter and has a substantially minimum group delay; and
provide processed versions of said one or more data samples.

7. The digital processor of claim 6, wherein said asymmetric cancellation pulse comprises side taps substantially only to one side of a center tap of the asymmetric cancellation pulse, wherein said one side is in a direction said one or more samples are processed.

8. The digital processor of claim 7, wherein said asymmetric cancellation pulse introduces new peaks associated with peak re-growth substantially only to said one side of said asymmetric cancellation pulse.

9. The digital processor of claim 6, wherein said peak cancellation rewinds by an amount greater than or substantially equal to a group delay of said asymmetric cancellation pulse before processing additional samples.

10. The digital processor of claim 6, wherein said one or more data samples are processed one or more of sample-by-sample and as a block of data samples.

11. A crest factor reduction block, comprising:
an input port to receive one or more data samples;
one or more peak detector and pulse cancellers to detect at least one peak in said one or more data samples and perform peak cancellation on said at least one detected peak by applying an asymmetric cancellation pulse to said at least one detected peak, wherein said asymmetric cancellation pulse is generated by a minimum phase filter and has a substantially minimum group delay; and
an output port to provide processed versions of said one or more data samples.

12. The crest factor reduction block of claim 11, wherein said asymmetric cancellation pulse comprises side taps substantially only to one side of a center tap of the asymmetric cancellation pulse, wherein said one side is in a direction said one or more samples are processed.

13. The crest factor reduction block of claim 12, wherein said asymmetric cancellation pulse introduces new peaks associated with peak re-growth substantially only to said one side of said asymmetric cancellation pulse.

14. The crest factor reduction block of claim 11, wherein said one or more peak detector and pulse cancellers rewind by an amount greater than or substantially equal to a group delay of said asymmetric cancellation pulse before processing additional samples.

15. The crest factor reduction block of claim 11, wherein said one or more data samples are processed one or more of sample-by-sample and as a block of data samples.

\* \* \* \* \*